United States Patent
Nozawa et al.

(10) Patent No.: US 6,224,677 B1
(45) Date of Patent: May 1, 2001

(54) GAS RECOVERY UNIT UTILIZING DUAL USE OF GAS

(75) Inventors: Shigeyoshi Nozawa, Osaka; Shinji Tomita, Hyogo-ken, both of (JP)

(73) Assignee: Teisan Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/679,234

(22) Filed: Jul. 12, 1996

(30) Foreign Application Priority Data

Jul. 17, 1995 (JP) ................................... 7-179923

(51) Int. Cl.[7] .................................................. C23C 16/00
(52) U.S. Cl. ......................... 118/715; 118/724; 156/345; 95/41; 95/45; 95/47; 95/53; 95/59; 95/128; 95/131; 95/142; 95/149
(58) Field of Search .................... 118/715, 724; 156/345; 95/41, 45, 47, 53, 54, 128, 131, 142, 149

(56) References Cited

U.S. PATENT DOCUMENTS

| | | |
|---|---|---|
| 2,947,687 | 8/1960 | Lee . |
| 2,953,502 | 9/1960 | Binning et al. . |
| 2,960,462 | 11/1960 | Lee et al. . |
| 2,970,106 | 1/1961 | Binning et al. . |
| 3,508,994 | 4/1970 | Nyrop . |
| 3,616,607 | 11/1971 | Klass . |
| 3,648,845 | 3/1972 | Riley . |
| 4,086,310 | 4/1978 | Bottenbruch et al. . |
| 4,113,628 | 9/1978 | Alegranti . |
| 4,132,824 | 1/1979 | Kimura et al. . |
| 4,155,793 | 5/1979 | Salemme et al. . |
| 4,156,597 | 5/1979 | Browall . |
| 4,192,824 | 3/1980 | Robinson et al. . |
| 4,378,324 | 3/1983 | Makino et al. . |
| 4,460,526 | 7/1984 | Makino et al. . |
| 4,474,662 | 10/1984 | Makino et al. . |
| 4,485,056 | 11/1984 | Makino et al. . |
| 4,512,893 | 4/1985 | Makino et al. . |
| 4,551,197 | * 11/1985 | Guilmette et al. ................... 156/642 |
| 4,553,983 | 11/1985 | Baker . |
| 4,602,922 | 7/1986 | Cabasso et al. . |
| 4,664,669 | 5/1987 | Ohyabu et al. . |
| 4,689,267 | 8/1987 | Takamizawa et al. . |

(List continued on next page.)

FOREIGN PATENT DOCUMENTS

| | | |
|---|---|---|
| 0 636 707 A2 | * 2/1995 | (EP) . |
| 0 638 923 A2 | * 2/1995 | (EP) . |
| 0636707A2 | * 2/1995 | (EP) . |

Primary Examiner—Terrel Morris
Assistant Examiner—Norca L. Torres
(74) Attorney, Agent, or Firm—Burns, Doane, Swecker & Mathis, L.L.P.

(57) ABSTRACT

A CVD device A is provided which is equipped with a gas introduction part A3 having an inert gas supply part G1 for supplying a diluting inert gas and a cleaning gas supply path G2 for supplying a cleaning gas, each connected therewith, and equipped with an exhaust gas discharge part A4 for releasing an exhaust gas; an exhaust gas circulation part D1 for circulating an exhaust gas from the CVD device, a cooling part D4 for cooling down and liquefying the cleaning gas in the exhaust gas, and a recovery part 4 for recovering the cleaning gas liquefied in said cooling part D4; the diluting inert gas is composed of a gas having a boiling point lower than that of the cleaning gas; a supply part 6 for supplying a cooling inert gas having the same composition as the diluting inert gas in a liquid state, an inert gas circulation part D3 which is cooled down by heat of evaporation of the cooling inert gas, and an inert gas discharge part 7 for discharging the cooling inert gas evaporated in the inert gas circulation part D3 are provided, constituting the cooling part D4; and the inert gas discharge part 7 is connected to the inert gas supply path G1.

18 Claims, 2 Drawing Sheets

U.S. PATENT DOCUMENTS

Figure 1:
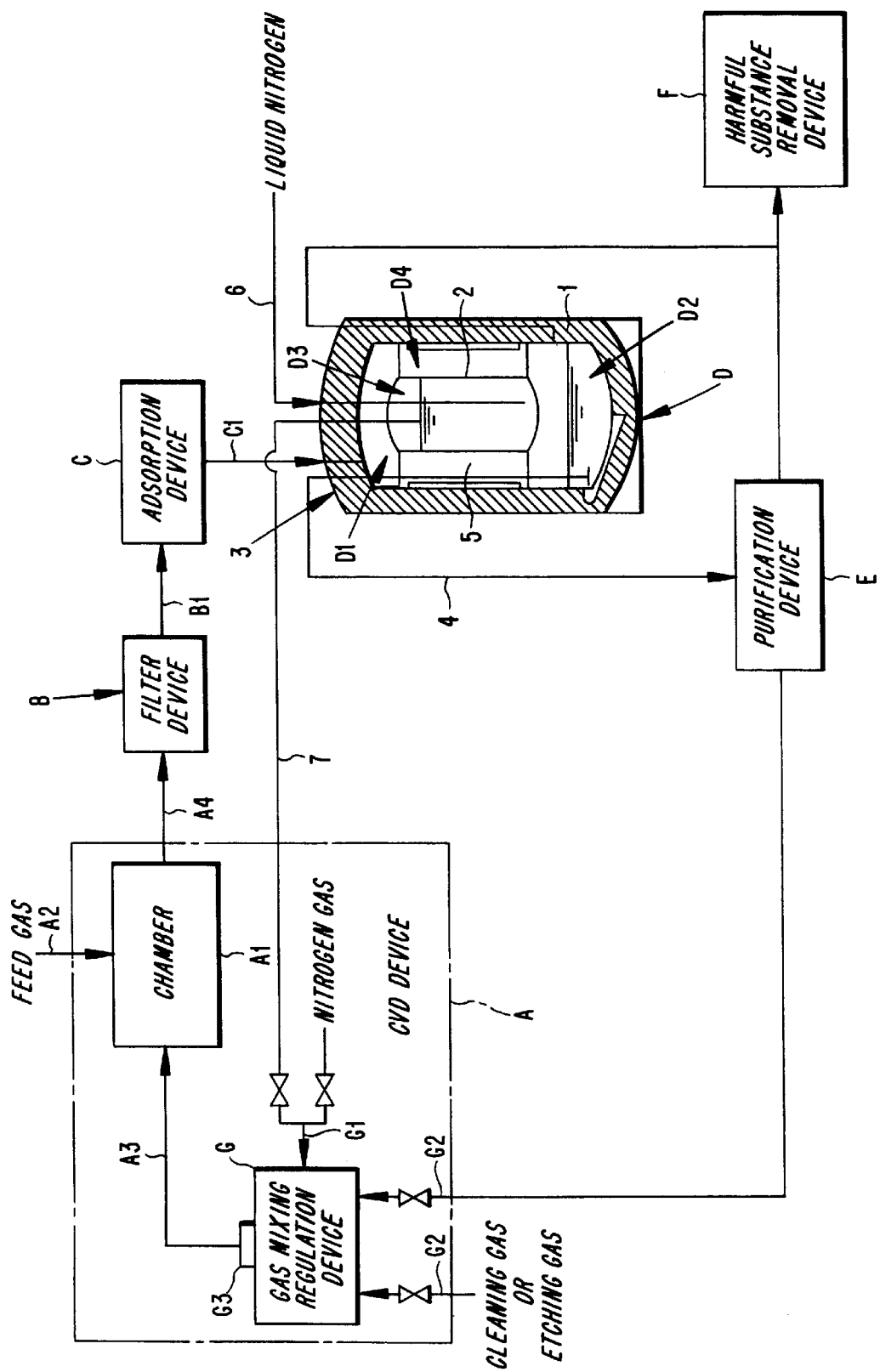

| | | |
|---|---|---|
| 4,713,292 | 12/1987 | Takemura et al. . |
| 4,714,481 | 12/1987 | Matsuura et al. . |
| 4,717,394 | 1/1988 | Hayes . |
| 4,741,829 | 5/1988 | Takemura et al. . |
| 4,743,435 | 5/1988 | Kitahara et al. . |
| 4,756,932 | 7/1988 | Puri . |
| 4,784,837 | 11/1988 | Kitayama et al. . |
| 4,826,599 | 5/1989 | Bikson et al. . |
| 4,910,001 | 3/1990 | Kitahara et al. . |
| 4,975,259 * | 12/1990 | Hyakutake et al. ................. 423/406 |
| 4,996,030 | 2/1991 | Kitahara et al. . |
| 5,085,676 | 2/1992 | Ekiner et al. . |
| 5,182,088 | 1/1993 | Leondaridis et al. . |
| 5,240,471 | 8/1993 | Barbe et al. . |
| 5,281,255 | 1/1994 | Toy et al. . |
| 5,326,723 * | 7/1994 | Petro et al. ........................... 437/192 |
| 5,378,439 | 1/1995 | Delobel et al. . |
| 5,383,957 | 1/1995 | Barbe et al. . |
| 5,759,214 * | 6/1998 | Ohmi et al. ......................... 29/25.01 |
| 5,785,741 * | 7/1998 | Li et al. ................................ 96/361 |

\* cited by examiner

GAS RECOVERY UNIT UTILIZING DUAL USE OF GAS

BACKGROUND OF THE INVENTION

1. Field of the Invention

The present invention relates to a gas recovery unit in which a Chemical Vapor Deposition ("CVD") device is provided which is equipped with a gas introduction portion having an inert gas supply path for supplying a diluting inert gas, and a cleaning gas supply path for supplying a cleaning gas, each connected therewith, and equipped with an exhaust gas discharge portion for releasing an exhaust gas. The present invention also relates to a gas recovery unit in which an etching device is provided which is equipped with a gas introduction portion having an inert gas supply path for supplying a diluting inert gas, and an etching gas supply path for supplying an etching gas, each connected therewith, and equipped with an exhaust gas discharge portion for releasing an exhaust gas.

2. Description of the Related Art

In a gas recycle unit in which a CVD device is provided, the CVD is equipped with a gas introduction part having an inert gas supply path for supplying a diluting inert gas and a cleaning gas supply path for supplying a cleaning gas, each connected with the CVD device. The CVD device is further equipped with an exhaust gas discharge portion for releasing an exhaust gas, foreign matters such as silicon dioxide ($SiO_2$), polysilicon, silicon nitride, metal silicide and amorphous silicon which are produced in said CVD device. It is therefore necessary to remove these foreign matters from the inside of the CVD device because they may have an adverse influence upon products in the CVD device. Accordingly, the introduction of a cleaning gas into the CVD device has been used to convert these foreign matters to volatile substances and to remove them. Namely, if a chemical compound, for example nitrogen trifluoride ($NF_3$), which can react with these foreign matters so that they are converted to gaseous components, is introduced into said CVD device, silicon dioxide ($SiO_2$) will be removed from the CVD device as silicon fluoride ($SiF_4$), converted therefrom by nitrogen trifluoride ($NF_3$). In the event that excess cleaning gas remains in the CVD device because it has not completely reacted with the foreign matter, it may be mixed in with the exhaust gas. Especially in a case where the cleaning gas is harmful, a gas recovery unit for recovering the cleaning gas has been proposed because the cleaning gas must be made harmless.

Additionally, in an etching device for bringing an etching gas which will react with a semiconductor film or the like into contact therewith to carry out etching, it has been desirable to recover the etching gas for the same reason.

Thus, an art of liquefying and recovering a cleaning gas or an etching gas can be devised. However, it has been pointed out that it is uneconomical to dispose of this cleaning or etching gas after it is made harmless because such gases are usually expensive. It is therefore desirable to develop an art of effectively and economically utilizing these gases.

OBJECTS AND SUMMARY

It is an object of the present invention to provide a gas recycle unit having a higher recovery efficiency and a less expensive operation cost.

It is another object of the present invention to provide a gas recovery unit for liquefying and recovering a cleaning gas or an etching gas and to reuse the recovered cleaning gas or etching gas.

It is another object of the present invention to provide a device and process capable of effectively recovering a harmful gas at a lower cost.

The characteristic construction of a gas recovery unit according to the present invention for the purpose of achieving these objects can be generally described.

Such a unit can include a CVD device which is equipped with a gas introduction portion having an inert gas supply path for supplying a diluting inert gas and a cleaning gas supply path for supplying a cleaning gas, each connected with the CVD device. The CVD device is also equipped with: an exhaust gas discharge portion for releasing an exhaust gas; an exhaust gas circulation path for circulating an exhaust gas from the CVD device; a cooling portion for cooling down and liquefying the cleaning gas in the exhaust gas; a recovery portion for recovering the cleaning gas liquefied in the cooling part; a gas recycle path is also provided for supplying the cleaning gas recovered in the recovery portion to the gas introduction portion.

In an alternative embodiment, such a unit can include an etching device equipped with a gas introduction portion having an inert gas supply path for supplying a diluting inert gas and an etching gas supply path for supplying an etching gas, each connected with the etching device. The etching device is also equipped with an exhaust gas discharge portion for releasing an exhaust gas, an exhaust gas circulation path for circulating an exhaust gas from the etching device, a cooling portion for cooling down and liquefying the etching gas in the exhaust gas, and a recovery portion for recovering the etching gas liquefied in the cooling part. A gas recycle path is also provided for supplying the etching gas recovered in the recovery portion to the gas introduction portion.

The diluting inert gas may include a gas having a boiling point lower than that of the cleaning gas or, alternatively, of the etching gas. The unit further may include a supply portion for supplying in a liquid state a cooling inert gas having the same composition as the diluting inert gas; an inert gas circulation portion which is cooled down by evaporation of the cooling inert gas; and an inert gas discharge portion for discharging the cooling inert gas evaporated in the inert gas circulation part, thereby constituting the cooling part. The inert gas discharge portion may be connected to the inert gas supply path.

The cleaning gas and/or the etching gas preferably contains at least any one of nitrogen trifluoride ($NF_3$), hexafluoroethane ($C_2F_6$), chlorine trifluoride ($ClF_3$), carbon tetrafluoride ($CF_4$), trifluoromethane ($CHF_3$), sulfur hexafluoride ($SF_6$), hydrogen chloride (HCl), fluorine gas ($F_2$), and chlorine gas ($Cl_2$).

Further preferably, the inert gas is nitrogen gas.

BRIEF DESCRIPTION OF THE DRAWING FIGURES

Figure 2:
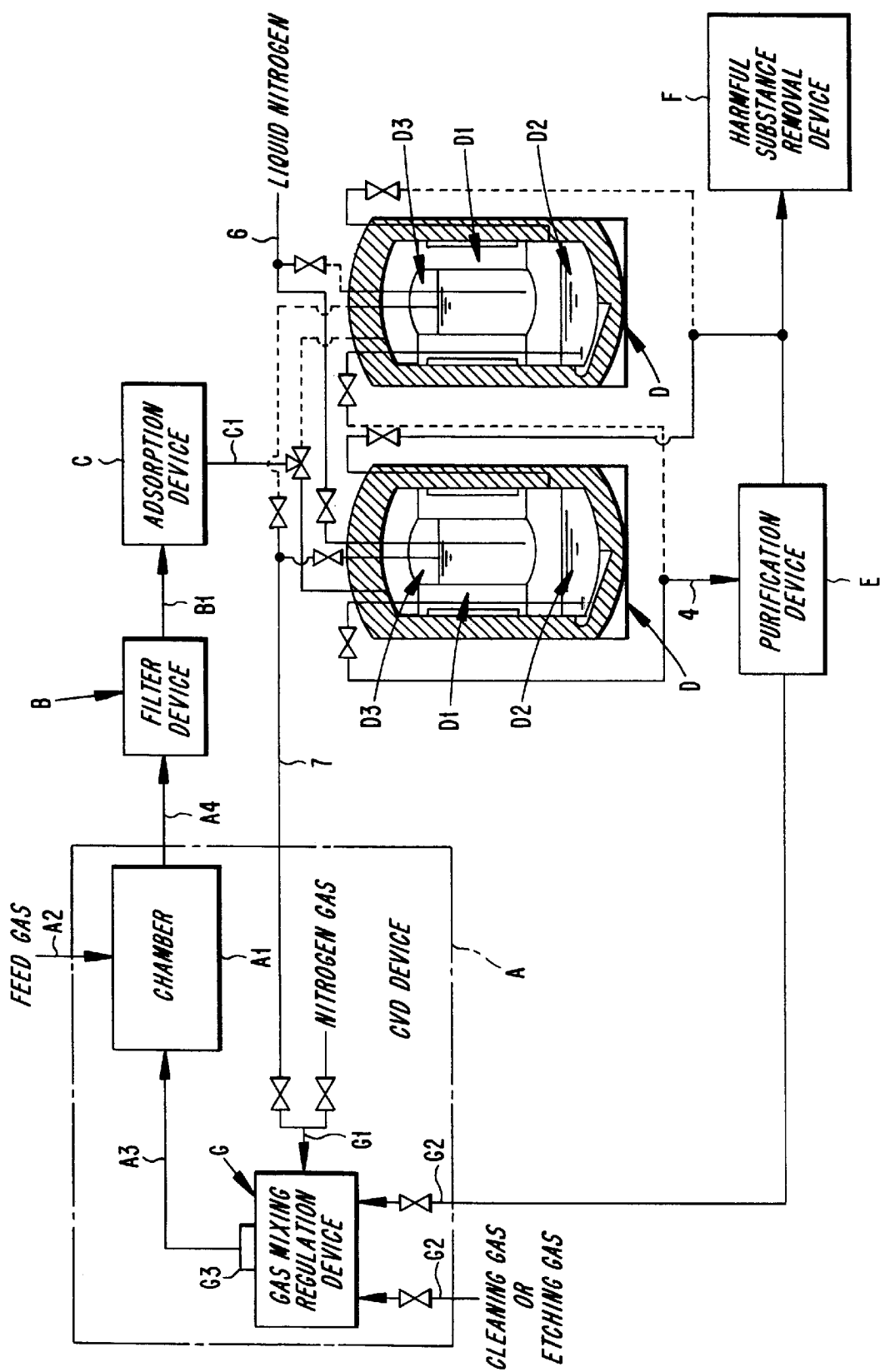

FIG. 1 is a diagrammical view of the gas recycling unit of the present invention; and FIG. 2 is a diagrammical view of the gas recycling unit according to another embodiment.

DETAILED DESCRIPTION OF THE PREFERRED EMBODIMENTS

By constituting a gas recycle unit such that an exhaust gas from the CVD device or the etching device is cooled down at the cooling portion in the exhaust gas circulation portion, it is possible to recover a cleaning gas and/or an etching gas from the exhaust gas of the CVD device at the etching device. Since a gas recycle path for supplying a gas from the recovery portion to the gas introduction portion is provided, it is possible to reuse the cleaning gas and/or the etching gas recovered in the recovery part.

If a cooling inert gas having a boiling point lower than that of either the cleaning gas or the etching gas is supplied to the inert gas circulation portion of the cooling portion, it becomes possible to cool down the cooling portion to a temperature lower than the boiling point of the cleaning gas and the etching gas. The cleaning gas and/or etching gas is thereby liquefied without using the power of a compressor or the like, only by causing the cooling inert gas to evaporate in the inert gas circulation portion.

Since the cooling inert gas is chosen to have the same composition as the diluting inert gas for diluting the cleaning gas and/or etching gas, and the inert gas discharge portion for discharging the cooling inert gas is connected with the inert gas supply path for the CVD device or the etching device, the cooling inert gas evaporated in the inert gas circulation portion can be used as the diluting inert gas to be introduced into either the CVD device or the etching device.

Even when a cleaning gas or an etching gas is harmful to the environment, the cleaning gas or the etching gas does not negatively impact the environment because the effective components thereof can be recycled. In a case where the cleaning gas or the etching gas is expensive, the necessity of using a large amount of the cleaning gas or the etching gas decreases, with a capability of restraining the operation cost, because the efficiency of using the cleaning gas or the etching gas with the CVD device or the etching device rises.

By cooling the cleaning gas and/or the etching gas, without using the power of a compressor or the like, an exhaust gas can be cooled down at a higher cooling efficiency and the cleaning gas and/or the etching gas can be reliably liquefied and recovered.

If the cooling inert gas is used as a diluting inert gas for the CVD device or the etching device, it will become possible to provide a gas recovery unit having such a simple construction that only one system of inert gas supply need be provided. By using an inert gas supply system for supplying both the cooling inert gas and for supplying diluting inert gas, operation cost can be saved.

If the cleaning gas or the etching gas contains at least one of nitrogen trifluoride ($NF_3$), hexafluoroethane ($C_2F_6$), chlorine trifluoride ($ClF_3$), carbon tetrafluoride ($CF_4$), trifluoromethane ($CHF_3$), sulfur hexafluoride ($SF_6$), hydrogen chloride (HCl), fluorine gas ($F_2$), and chlorine gas ($Cl_2$), there are many advantages. Specifically, foreign matters in the CVD device and matters to be etched in the etching device can be effectively evaporated. The CVD device and the etching device can be effectively operated even when a low concentration of cleaning gas or an etching gas is used, and the amount used of cleaning gas or etching gas can be restrained, thereby saving the operation cost and making easy recycling of the cleaning gas or etching gas.

Preferably the cleaning gas and the etching gas are gases which can be decomposed in the CVD device or the etching device to generate halogen radicals (such as chlorine radical, fluorine radical, or iodine radical).

Further, nitrogen gas is preferably used as the inert gas because it is inexpensive and has a boiling point lower than that of the various cleaning gases and etching gases.

Now referring to the drawings, an embodiment of the present invention will be described.

As shown in FIG. 1, the gas recovery unit according to the present invention is constructed such that a recycle device body D is provided downstream of an exhaust gas discharge pipe A4 of a CVD device A by way of a filter device B and an adsorption device C. A storage part D2 for storing a liquid obtained by cooling down an exhaust gas is provided in the recycle device body D, and further a purification device E for purifying the liquid stored in the storage part D2 and a harmful substance removal device F for removing harmful substances from a gaseous component coming from the recycle device body D and purification device E are connected in fluid communication.

The CVD device A includes a chamber A1 for forming a silicon film which will be used in a thin film transistor ("TFT") liquid crystal or the like, and a gas mixing and regulation device G for introducing into the chamber A1 a cleaning mixed gas prepared by mixing 1% of nitrogen trifluoride ($NF_3$) in nitrogen gas. Chamber A1 is constructed with a feed gas introduction pipe A2 for a feed gas for forming, e.g., a silicon film, a cleaning mixed gas introduction pipe A3 for introducing gas from the gas mixing and regulation device G, and an exhaust gas discharge pipe A4 for discharging an exhaust gas from the inside of the chamber. A such as a substrate mount (not shown) for installing a substrate, on which a silicon film is to be formed, and a plasma generation part (not shown) are provided within the chamber A1.

The filter device B, provided in succession to the exhaust gas discharge pipe A4, is constructed such that a filter (not shown) for filtering the exhaust gas from the exhaust gas discharge pipe A4 is built in the filter device B, to remove solid components such as silicon component produced in the CVD device A. A discharge pipe B1 is further provided, thereby enabling filtering of the solid components from the exhaust gas.

The adsorption device C provided in succession to the discharge pipe B1 is constructed such that an adsorption column (not shown) is built in the absorption device C, for adsorbing and removing gaseous components having a boiling point higher than that of the cleaning or etching gas, e.g., nitrogen trifluoride ($NF_3$), for example moisture and carbon dioxide gas, contained in the exhaust gas from the discharge pipe B1. A discharge pipe C1 is further provided, thereby enabling adsorption and removal of such high boiling point gases.

The recycle device body D is composed of a thermally insulated tank 1. In the thermally insulated tank 1, a refrigerant tank 2 is built so as to include a cooling part D4 and an introduction part 3 for introducing an exhaust gas from the discharge pipe C1 into a space between the thermally insulated tank 1 and the refrigerant tank 2. In the lower portion of the thermally insulated tank 1, a storage part D2 is formed for storing a liquid condensed within the thermally insulated tank 1, and a recovery pipe 4 is provided for recovering the liquid in the storage part D2. In the inside of the thermally insulated tank 1 is formed an exhaust gas circulation part D1 for circulating the exhaust. The refrigerant tank 2 has a plurality of fins 5 provided on its outer peripheral surface in order to make larger the contact area of the exhaust gas flowing in the exhaust gas circulation part D1 with the refrigerant tank 2.

In the refrigerant tank 2, a supply pipe 6 is provided for supplying, e.g., liquid nitrogen, so as to form a liquid nitrogen supply part, and further an inert gas recovery pipe 7 is provided for discharging out of the refrigerant tank 2 nitrogen gas generated by the evaporation of the liquid nitrogen in the refrigerant tank 2 so as to form an inert gas circulation part D3 where the cooling inert gas is circulated.

The purification device E is constructed such that a rectification unit (not shown) is provided for rectifying a liquid recovered by way of the recovery pipe 4, whereby pure cleaning gas, e.g., nitrogen trifluoride ($NF_3$), can be obtained by rectification. The nitrogen trifluoride ($NF_3$) obtained will be used as the cleaning gas to be supplied to the CVD device A.

The harmful substance removal device F is constructed so as to be capable of applying high energy such as plasma or heat to the gas which has not been liquefied in the exhaust gas circulation part of the recycle device body D and the exhaust gas from the purification device E, in order to completely decompose nitrogen trifluoride ($NF_3$) remaining or admixed therein, so that the gas is made harmless and permitted to be released to the atmosphere.

The gas mixing and regulation device G is constructed such that an inert gas supply pipe G1 for mixing and supplying nitrogen gas from the inert gas recovery pipe 7 of the recycle device body D and concentration-regulating nitrogen gas, and a cleaning gas supply pipe G2 for supplying cleaning gas, are connected in communication with device G. The nitrogen gas recovered from the inert gas recovery pipe 7, the nitrogen gas supplied from the inert gas supply pipe G1, and the nitrogen trifluoride gas ($NF_3$) supplied from the cleaning gas supply pipe G2 are mixed to prepare cleaning mixed gas. Such a mixed gas may be comprised of nitrogen gas and 1% of nitrogen trifluoride ($NF_3$) admixed therein. The prepared cleaning mixed gas is freely discharged from a cleaning mixed gas discharge port G3. From the cleaning mixed gas discharge port G3, the cleaning mixed gas introduction pipe A3 leads to chamber A1 so as to supply the cleaning mixed gas to the chamber A1.

When foreign matter is generated in chamber A1 and chamber A1 must be washed, the feed gas introduction pipe A2 of chamber A1 is first closed, substrates in the chamber A1 are taken out, and liquid nitrogen is supplied to the inert gas circulation part D3 of the recycle device body D. After the cooling part of the recycle device body D has sufficiently cooled down, both chamber A1 and the cleaning mixed gas introduction pipe A3 are opened, and a cleaning mixed gas containing nitrogen trifluoride gas is introduced into chamber A1. Since nitrogen trifluoride gas is then reacted with the foreign matter so that the foreign matter is evaporated, the inside of chamber A1 is washed. And as nitrogen trifluoride gas is used in relative excess at that time, an exhaust gas containing an excess of nitrogen trifluoride gas is easily caused to flow into the exhaust gas discharge pipe A4. By removing foreign matter mixed in a solid state in the exhaust gas by means of the filter device B, and further by removing high boiling point gases from the exhaust gas by means of the adsorption device C, the exhaust gas is easily converted to a gas consisting of only nitrogen trifluoride gas and low boiling point gases mixed in nitrogen gas. When this exhaust gas is circulated through the exhaust gas circulation part of the recycled device body D, the exhaust gas is cooled down by contact with the refrigerant tank 2 and the fins 5 provided on the refrigerant tank 2, so that the nitrogen trifluoride gas is condensed, caused to flow downward, and accumulated in the storage part D2. If a predetermined amount of liquid nitrogen trifluoride is accumulated, the liquid will be recovered by the recovery pipe 4, sent to the purification device E, and purified for reuse. In addition, the nitrogen gas generated from the cooling inert gas supplied in the cooling part is conveyed to the gas mixing and regulation device G through the inert gas recovery pipe 7 and will be utilized as the diluting inert gas.

According to another aspect of the invention, the recycle device body may include a detachable storage tank as the storage part D2, as part of the thermally insulated tank, for storing the liquefied exhaust gas. Two of such thermally insulated tanks or the storage tanks may be provided so that they can be selectively used, as shown in the embodiment depicted in FIG. 2. Since the thermally insulated tanks or the storage tanks can be conveyed as they are taken out of the gas recycle unit, such an arrangement is effective for recycling the cleaning gas or the etching gas even when the purification device must be provided at a remote place.

According to another aspect of the invention, the gas mixing and regulation device may be omitted and the composition of a cleaning mixed gas to be supplied into the chamber can be freely regulated by valves provided in the inert gas supply pipe G1 and cleaning gas supply pipe G2 which deliver gas directly to the CVD device.

The cleaning gas used in the present invention may include nitrogen trifluoride ($NF_3$), hexafluoroethane ($C_2F_6$), chlorine trifluoride ($ClF_3$), carbon tetrafluoride ($CF_4$), trifluoromethane ($CHF_3$), sulfur hexafluoride ($SF_6$), hydrogen chloride (HCL), fluorine gas ($F_2$), and chlorine gas ($CL_2$). These gases may be used in a CVD device to be washed. When nitrogen trifluoride ($NF_3$) is used, foreign matter, including silicon compounds such as silicon dioxide ($SiO_2$), polysilicon, metal silicide (e.g., tungsten silicide ($WSi_x$)) can be removed.

The inert gas used in the present invention preferably is a gas having a boiling point lower than that of said cleaning gas. When nitrogen gas is used, a higher general usability is obtained because its boiling point is lower than that of the above-mentioned various cleaning gases and it is relatively inexpensive. However, argon gas or another gas may also be used.

According to another aspect of the invention, the gas recycle device may be applied to an etching device constructed such that after a mask is applied to a substrate having a silicon film vapor-deposited thereon, the surface of the substrate, not covered with the mask, is etched by an etching gas, in place of the aforementioned CVD device. In addition, the etching device corresponds to the CVD device A shown in FIG. 1 and the etching gas corresponds to the cleaning gas.

According to another aspect of the invention where the cleaning mixed gas regulation device is provided in the aforementioned CVD device, the cleaning mixed gas introduction pipe is generically called the gas introduction part. In a case where the cleaning mixed gas regulation device is not provided, a combination of the inert gas supply pipe and the cleaning gas supply pipe is generically called the gas introduction part. A combination of the exhaust gas discharge pipe A4 and discharge pipes B1, C1 is generically called the exhaust gas discharge part. That portion where the cleaning gas or the etching gas liquefied from the storage part D2, through the purification device and by way of the recovery pipe 4, is recovered is generically called the recovery part. So long as the device can recycle the liquefied cleaning gas or the etching gas, the present invention need not be limited to the construction of the aforementioned embodiment.

While the invention has been described in detail with reference to specific embodiments thereof, it will be apparent to one skilled in the art that various changes and modification can be made, and equivalents employed, without departing from the spirit and scope of the invention.

We claim:

1. A gas recovery unit, comprising:
   a CVD device including a gas introduction portion, an inert gas supply path in fluid communication with and for supplying a diluting inert gas into said gas introduction portion, a cleaning gas supply path in fluid communication with and for supplying a cleaning gas into said gas introduction portion, and an exhaust gas discharge path in fluid communication with and for discharging an exhaust gas from said CVD device;
   a recycling device body in fluid communication with said CVD device, said recycling device body including an exhaust gas circulation portion in fluid communication with said CVD device exhaust gas discharge path for circulating an exhaust gas from said CVD device, a cooling portion for cooling and liquefying any cleaning gas remaining in said exhaust gas in fluid communication with said CVD device inert gas supply path, and a recovery portion for recovering the cleaning gas liquefied in said cooling portion; and
   a gas recycle path in fluid communication between said recycling device body recovery portion and said CVD device cleaning gas supply path for supplying said cleaning gas recovered in said recovery portion to said gas introduction portion.

2. A gas recovery unit according to claim 1, wherein said diluting inert gas comprises a gas having a boiling point lower than that of said cleaning gas or etching gas; and
   said unit further comprising a supply portion in fluid communication with said cooling portion for supplying a cooling inert gas in a liquid state having substantially the same composition as said diluting inert gas, an inert gas circulation portion capable of being cooled down by heat of evaporation of said cooling inert gas, and an inert gas discharge portion for discharging said cooling inert gas evaporated in said inert gas circulation part, said inert gas discharge portion connected to said inert gas supply path.

3. A gas recovery unit according to claim 1, wherein said cleaning gas comprises a gas selected form the group consisting of nitrogen trifluoride ($NF_3$), hexafluoroethane ($C_2F_6$), chlorine trifluoride ($ClF_3$), carbon tetrafluoride ($CF_4$), trifluoromethane ($CHF_3$), sulfur hexafluoride ($SF_6$), hydrogen chloride (HCl), fluorine gas ($F_2$), and chlorine gas ($Cl_2$).

4. A gas recovery unit, according to claim 1, wherein said diluting inert gas is nitrogen gas.

5. A gas recovery unit comprising:
   an etching device including a gas introduction portion, an inert gas supply path in fluid communication with and for supplying a diluting inert gas into said gas introduction portion, an etching gas supply path in fluid communication with and for supplying an etching gas into said gas introduction portion, and an exhaust gas discharge path in fluid communication with and for discharging an exhaust gas from said etching device;
   a recycling device body in fluid communication with said etching device, said recycling device body including an exhaust gas circulation portion in fluid communication with said etching device exhaust gas discharge path for circulating an exhaust gas from said etching device, a cooling portion for cooling and liquefying any etching gas remaining in said exhaust gas in fluid communication with said etching device inert gas supply path, and a recovery portion for recovering the etching gas liquefied in said cooling part; and
   a gas recycle path in fluid communication between said recycling device body recovery portion and said etching device gas supply path for supplying said etching gas recovered in said recovery portion to said gas introduction portion.

6. A gas recovery unit according to claim 5, wherein said diluting inert gas comprises a gas having a boiling point lower than that of said cleaning gas or etching gas; and
   said unit further comprising a supply portion in fluid communication with said cooling portion for supplying a cooling inert gas in a liquid state having substantially the same composition as said diluting inert gas, an inert gas circulation portion capable of being cooled down by heat of evaporation of said cooling inert gas, and an inert gas discharge portion for discharging said cooling inert gas evaporated in said inert gas circulation part, said inert gas discharge portion connected to said inert gas supply path.

7. A gas recovery unit according to claim 5, wherein said etching gas comprises a gas selected form the group consisting of nitrogen trifluoride ($NF_3$), hexafluoroethane ($C_2F_6$), chlorine trifluoride ($ClF_3$), carbon tetrafluoride ($CF_4$), trifluoromethane ($CHF_3$), sulfur hexafluoride ($SF_6$), hydrogen chloride (HCl), fluorine gas ($F_2$), and chlorine gas ($Cl_2$).

8. A gas recovery unit, according to claim 5, wherein said diluting inert gas is nitrogen gas.

9. A process for recycling a processing gas used in a processing chamber, comprising the steps of:
   using a processing gas in a processing chamber to perform cleaning of the processing chamber or etching of a substrate;
   discharging said processing gas from said processing chamber;
   liquefying said discharged processing gas by cooling said processing gas to a temperature below the boiling point of said processing gas, to produce liquified recycled processing gas;
   introducing said recycled processing gas into said processing chamber;
   wherein said liquefying step further includes the step of placing said discharged processing gas in heat transfer communication with a second gas in liquid state, said second gas having a boiling temperature lower than that of said processing gas, to cool said discharged processing gas to a temperature below said boiling temperature of said processing gas and to at least partially vaporize said second gas; and
   mixing said vaporized second gas with said recycled processing gas, said mixing step occurring at a time selected from the group consisting of before said introducing step and after said step of placing said discharged processing gas in heat transfer communication with said second gas.

10. A process for recycling a processing gas according to claim 9, wherein said processing gas is a cleaning gas and said processing chamber is a CVD device.

11. A process for recycling a processing gas according to claim 9, wherein said processing gas is an etching gas and said processing chamber is an etching device.

12. A process for recycling a processing gas according to claim 9, further including the step of filtering said processing gas after said step of discharging said processing gas, to filter solids from said processing gas.

13. A process for recycling a processing gas according to claim 9, further including the step of adsorbing and removing from said processing gas other gases which have a boiling point higher than that of said processing gas, said adsorbing and removing step occurring after said discharging step.

14. A process for recycling a processing gas according to claim 9, further including the step of rectifying said liquified recycled processing gas to produce substantially pure processing gas, said rectifying step occurring after said liquefying step.

15. A process for recycling a processing gas according to claim 9, wherein said liquefying step further includes the step of placing said discharged processing gas in heat transfer communication with a second gas in liquid state, said second gas having a boiling temperature lower than that of said processing gas, to cool said discharged processing gas to a temperature below said boiling temperature of said processing gas.

16. A process for recycling a processing gas according to claim 15, wherein said second gas is inert.

17. A process for recycling a processing gas according to claim 16, said mixing step occurring before said introducing step.

18. A process for recycling a processing gas according to claim 16, said mixing step occurring after said step of placing said discharged processing gas in heat transfer communication with said second gas.

* * * * *